US012621968B2

(12) United States Patent
Ruppert

(10) Patent No.: US 12,621,968 B2
(45) Date of Patent: May 5, 2026

(54) POWER ELECTRONIC ARRANGEMENT FOR AN ELECTRIC MACHINE AND MOTOR VEHICLE

(71) Applicant: AUDI AG, Ingolstadt (DE)

(72) Inventor: Daniel Ruppert, Lenting (DE)

(73) Assignee: Audi AG, Ingolstadt (DE)

( * ) Notice: Subject to any disclaimer, the term of this patent is extended or adjusted under 35 U.S.C. 154(b) by 193 days.

(21) Appl. No.: 18/539,104

(22) Filed: Dec. 13, 2023

(65) Prior Publication Data

US 2024/0206134 A1    Jun. 20, 2024

(30) Foreign Application Priority Data

Dec. 14, 2022    (DE) .......................... 102022133265.9

(51) Int. Cl.
| | |
|---|---|
| *H05K 7/20* | (2006.01) |
| *H01L 23/373* | (2006.01) |
| *H01L 23/473* | (2006.01) |
| *H02K 9/00* | (2006.01) |
| *H02M 7/00* | (2006.01) |

(52) U.S. Cl.
CPC ......... *H05K 7/209* (2013.01); *H01L 23/3735* (2013.01); *H01L 23/473* (2013.01); *H02K 9/00* (2013.01); *H02M 7/003* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 9,445,532 | B2 | 9/2016 | Chen et al. | |
| 2017/0164509 | A1* | 6/2017 | Flamm | H05K 7/14329 |
| 2022/0200468 | A1* | 6/2022 | Flamm | H02M 7/003 |
| 2022/0311349 | A1* | 9/2022 | Pahn | H02G 5/02 |
| 2022/0385081 | A1* | 12/2022 | Yu | H05K 7/20409 |
| 2023/0171909 | A1* | 6/2023 | Liu | B23K 33/00 |
| | | | | 257/691 |
| 2024/0022180 | A1* | 1/2024 | Ewald | H05K 1/181 |
| 2024/0258196 | A1* | 8/2024 | Woo | H01L 23/36 |

(Continued)

FOREIGN PATENT DOCUMENTS

| | | | |
|---|---|---|---|
| DE | 102004052287 | A1 | 5/2006 |
| DE | 102014106395 | A1 | 11/2014 |

(Continued)

*Primary Examiner* — Courtney L Smith
(74) *Attorney, Agent, or Firm* — Seed Intellectual Property Law Group LLP

(57) ABSTRACT

A power electronic arrangement for an electric machine, includes an inverter, power electronic components accommodated in at least one power module, an intermediate circuit connected to the inverter across connection contacts of the at least one power module and having at least one intermediate circuit energy accumulator, and a heat sink to which the at least one power module is thermally connected for cooling, the connection contacts are arranged at a margin and flat against a substrate carrying one or more power semiconductors, and are thermally coupled to the heat sink via the substrate, wherein the at least one intermediate circuit energy accumulator is connected electrically and thermally to the connection contacts to cool the at least one intermediate circuit energy accumulator.

11 Claims, 2 Drawing Sheets

(56)     References Cited

U.S. PATENT DOCUMENTS

2024/0291414 A1 *   8/2024   Speinle ................ H05K 1/0203
2024/0356554 A1 *   10/2024  Kim ................. H03K 19/00315

FOREIGN PATENT DOCUMENTS

DE        102019122511  A1     2/2021
DE        102021203144  A1     9/2022
EP             3723109  A1    10/2020
JP            201788998  A     10/2017

* cited by examiner

POWER ELECTRONIC ARRANGEMENT FOR AN ELECTRIC MACHINE AND MOTOR VEHICLE

BACKGROUND

Technical Field

The disclosure relates to a power electronic arrangement for an electric machine, comprising an inverter, the power electronic components of which are accommodated in at least one power module, an intermediate circuit connected to the inverter across connection contacts of the at least one power module and having at least one intermediate circuit energy accumulator, especially an intermediate circuit capacitor, and a heat sink, to which the at least one power module is thermally connected for cooling. In addition, the disclosure relates to a motor vehicle.

Description of the Related Art

Electric machines, such as synchronous machines or asynchronous machines, are used as traction machines in motor vehicles, such as electric motor vehicles and hybrid motor vehicles. For the operation of the electric machine from a DC voltage network, which can be powered for example from a high-voltage battery of the motor vehicle, a power electronic arrangement associated with the electric machine comprises an inverter, which can also be called a traction inverter or a drive inverter. The electric machine is usually connected to the DC voltage network across an intermediate circuit having at least one intermediate circuit energy accumulator, usually at least one intermediate circuit capacitor. The inverter, which is usually realized through a bridge circuit, comprises power semiconductor components, especially semiconductor switches and diodes, which need to be cooled. For this, a cooling device is usually provided, having a heat sink to which the power semiconductor components are thermally connected for the cooling. For example, it can be provided for this that the power semiconductor components are provided in so-called power modules, such as molded half-bridge modules. One such power module can be provided for each phase of the electric machine. The power modules comprise, in addition to control leads, connection contacts at the machine side for connection to corresponding stator windings and connection contacts at the DC voltage side for connection to the intermediate circuit, especially the intermediate circuit energy accumulator.

It is known in the prior art how to realize the connection contacts by connecting tabs sticking out from the power module, to which corresponding connecting tabs of the intermediate circuit energy accumulator, especially the intermediate circuit capacitor, can be welded. Besides the desired current flow, a heat flow also occurs through the interface with the intermediate circuit energy accumulator, since the intermediate circuit capacitor is usually not connected to the cooling device.

Thus, the power electronic arrangements known in the prior art have the drawback that the cooling or the cooling fluid flow is only confined to the semiconductor components of the power modules. The intermediate circuit energy accumulator is not connected to this cooling, especially this active cooling. This results in larger design of the intermediate circuit capacitor, which brings with it higher production costs, larger design volume, and heavier weight. Because of premature derating, there may be a decrease in the maximum output power. The service life, especially that of the intermediate circuit energy accumulator, may be reduced by thermal stress.

In this context, it would also be conceivable to attach the intermediate circuit energy accumulator itself to the active cooling or an active cooling. However, this would lead to higher production costs for the power electronic arrangement and a more costly cooling device would be needed. The design volume and the weight of the power electronic arrangement would be increased.

JP 2017188998 A discloses a power converting device in which a current busbar is actively cooled in order to make possible a high-frequency drive with cooling of a high-temperature switch element, wherein a high temperature of a capacitor element is prevented. It is proposed here, specifically, to fasten the switch element and the capacitor each directly to a heat sink and in addition to also attach a connection site of busbars of the switch element and the capacitor to a surface of the heat sink across an electrically insulating, heat conducting material. A screw connection is proposed for this. In other words, not only are both a capacitor element and a switch element attached to the heat sink here, but also the busbars are attached to an intermediate point. This produces a complex and costly layout of the cooling device.

DE 10 2014 106 395 A1 discloses an integrated electric and thermal solution for a capacitor housing of an inverter of the intermediate circuit. Here, capacitor elements in a housing are electrically connected to a busbar, while the busbar is situated in proximity to an insulation layer and is configured to extend beneath the capacitor elements along the housing side and the housing length, in order to provide a broader pathway for the heat dissipation before coming into contact with the capacitor elements. EP 3 723 109 A1 also relates to an intermediate circuit capacitor cooling directly in the capacitor housing, where an integrated heat sink is realized and the housing contains a region for active fluid cooling.

BRIEF SUMMARY

Embodiments of the disclosure provide a power electronic arrangement for an electric machine which is improved in terms of production expense, design volume, and service life.

In a power electronic arrangement of the kind mentioned above, it is proposed according to the disclosure that the connection contacts are arranged at the margin and flat against a substrate carrying the power semiconductors or are formed from this, and they are thermally coupled to the heat sink via the substrate, wherein the at least one intermediate circuit energy accumulator is connected electrically and thermally to the connection contacts for the cooling of the at least one intermediate circuit energy accumulator.

The heat sink is preferably actively cooled, i.e., it comprises in particular a cavity through which a cooling fluid can be taken, such as cooling water.

Hence, it is proposed to configure the connection contacts of the power module such that the intermediate circuit energy accumulator, especially the intermediate circuit capacitor, can likewise be cooled through these connection contacts. For this, the connection contacts on the power module are designed such that they themselves have an excellent thermal connection to the heat sink. It is thus possible to dissipate the waste heat of the intermediate circuit energy accumulator to the heat sink via the connection to the power module. For this, it is proposed specifically to bring the connection contacts, which can also be called connection terminals, for the intermediate circuit energy accumulator directly onto the substrate of the power module. This means that the connection contacts are attached in the best way possible and flat against the heat sink, so that with the usual flat contacting it is possible to have an excellent heat flow from the intermediate circuit energy accumulator via the connection, especially a busbar, a corresponding connection tab, and the connection contact, to the heat sink. In other words, a cooling of the intermediate circuit energy accumulator is achieved through the power module, which is connected in any case to the heat sink.

Thanks to the cooling connection, the intermediate circuit energy accumulator, especially the intermediate circuit capacitor, can be smaller in design, which already results in lower production costs, smaller design volume and lower weight of the power electronic arrangement. A direct attachment of the overall intermediate circuit energy accumulator to the active cooling, in particular, is not necessary, resulting in a reduction of the production expense for the power electronic arrangement. Also, its design volume is reduced, as is the weight. A premature derating with reduction of the maximum output power can be avoided. The service life is increased by reducing the thermal stress. On the whole, a smaller, material-sparing realization can also be achieved in this regard because smaller copper cross sections are required for the connecting tabs of the intermediate circuit capacitor.

The connection contacts can comprise at least partly a metallization layer of the substrate. The metallization layer of power electronic substrates usually has a high thermal conductivity and serves, among other things, for distributing the heat from power electronic components as broadly as possible in order to transfer it to the attached heat sink. In particular, such a metallization layer can be a copper layer. The use of such a metallization layer to form the connection contacts thus already provides structurally an excellent attachment to the heat sink, since the already present thermal conduction structure of the power electronic substrate is utilized as directly as possible. For example, the substrate can be a Direct Bond Copper (DBC) substrate. This comprises a ceramic material, on which a metallization layer, especially a copper layer, is provided on at least one side, especially on both sides. Hence with the use of this copper layer, the connection contacts are therefore provided directly on the ceramic material.

The connection contacts may comprise a connection layer, especially a copper layer, applied to the substrate, especially a metallization layer of the substrate. In this way, the connection contacts can be strengthened, especially if they already encompass in part the metallization layer of the substrate, especially if the metallization layer of the substrate is kept rather thin.

As already mentioned, the intermediate circuit can be connected by flat connecting tabs, especially made of copper, to the connection contacts. A flat connection enables the most heat and electricity transmission possible. An especially advantageous embodiment in this respect calls for the connecting tabs being welded to the connection contacts, especially by way of laser welding and/or ultrasound welding. Thanks to such welding techniques, especially making do without additional material, a low-inductance connection of the intermediate circuit energy accumulator to the power module is possible. A bonded connection is realized, which is also preferable in terms of much better heat transfer. These benefits stand in contrast with, for example, a conceivable screw connection, in which both the electric and the thermal connection would be worse on account of the remaining spacing.

Advisedly, the at least one intermediate circuit energy accumulator can be received in a housing, from which the connecting tabs stick out. The connecting tabs, for example, may also contain a certain busbar section, before the actual contact region is reached. In particular, the connecting tabs can emerge flat into a layered structure in the housing, especially one forming the intermediate circuit capacitor, which further improves the optimal cooling connection. For a compact design of the power electronic arrangement as a whole, it is likewise especially advantageous for the housing to be installed close to the power modules on the heat sink.

Also speaking generally, the intermediate circuit energy accumulator can also be in particular an intermediate circuit capacitor, for example a thin layer capacitor, such as is basically known in the prior art and which can be easily realized, for example, in the already mentioned housing.

The power electronic modules can be molded, so that in particular the power electronic components of the power electronic module are supported by a hardened casting compound. In the case of a molding, the connection contacts are then left open, for example through corresponding cutouts, in order to provide the possibility of connecting the intermediate circuit energy accumulator.

With special advantage, the at least one power module can be thermally attached and fastened to the heat sink by soldering or sintering. Soldering or sintering provides an optimal thermal attachment to the heat sink at the same time as a good fastening. This further optimizes the heat flow.

As already mentioned, the heat sink can preferably comprise a cavity receiving a flow of a cooling fluid. The power modules are thus actively cooled by the heat sink, and this active cooling can also be used for the intermediate circuit energy accumulator due to the corresponding design and localization of the connection contacts. The cooling fluid can be cooling water, in particular.

Modifications of the disclosure can provide in this regard that the connection contacts are arranged in a region adjacent to the cavity, especially a cooling structure located in the cavity and associated with the at least one power module. If the cavity, especially the cooling structure, also extends into the edge region where the connection contacts are usually provided, these can be cooled directly from the side of the heat sink with good heat dissipation, since they are also located on the substrate. Ideally, for this, the cavity, especially the cooling structure provided in the cavity and defining for example a cooling pathway and/or increasing the effective cooling surface and/or causing swirling, can extend to cover entirely the surface of the power module and thus also offer an excellent cooling also in the edge regions which in particular are less influenced by the cooling of the power semiconductor components.

As already mentioned, the connection contacts are preferably arranged on a side edge of the substrate surface. A housing of the power module, whether formed by a hardened casting compound or in some other way, can provide a cutout above the connection contacts, in order to allow an easy contacting, especially by welding. Generally speaking, the heat sink may be elongated, especially in the case of multiphase, such as three-phase, electric machines, and it can carry the multiple power modules forming the inverter, especially configured as molded half-bridge modules, at its middle in the longitudinal direction. The connection contacts to the electric machine can then be provided on one long side, and on the other long side the connection contacts for the intermediate circuit, especially the intermediate circuit energy accumulator. Generally speaking, moreover, the connection contacts for the electric machine, especially the stator windings, can also be formed accordingly to the connection contacts for the intermediate circuit on the substrate.

As regards the intermediate circuit, it should further be mentioned that, in a housing having connecting tabs which are attached, especially by welding, to the connection contacts, multiple intermediate circuit energy accumulators, such as those interconnected for example in parallel and/or in series, especially intermediate circuit capacitors, can also be accommodated. In particular, the entire intermediate circuit can be formed in such a housing, which can then be called also an intermediate circuit housing.

While it is basically sufficient to provide two connection contacts on the power modules for the intermediate circuit, especially DC voltage plus (DC+) and DC voltage minus (DC−), cases may also be conceivable where more than two connection contacts are provided for the intermediate circuit, especially the intermediate circuit energy accumulator. For example, a configuration is advantageous in which a coaxial connection design is chosen, in which for example one connection contact for one polarity is arranged in the middle next to two connection contacts of the other polarity. For example, the sequence DC−, DC+, DC− is thus possible. In this way, stray inductances can be minimized in the commutation circuit.

Besides the power electronic arrangement, the present disclosure also relates to a motor vehicle, comprising an electric machine designed as a traction machine, and a power electronic arrangement according to the present disclosure, associated with the electric machine. All of the statements about the power electronic arrangement according to the disclosure can be applied analogously to the motor vehicle according to the disclosure, with which therefore the mentioned benefits can likewise be achieved.

In particular, the motor vehicle may comprise a traction energy accumulator, especially a high-voltage battery, which feeds a high-voltage network, the voltage of which is higher than the of a low-voltage network, such as a customary onboard network. The electric machine is hooked up to the high-voltage network across the power electronic arrangement and the motor vehicle can be driven by it.

BRIEF DESCRIPTION OF THE SEVERAL VIEWS OF THE DRAWINGS

Further benefits and details of the present disclosure will emerge from the exemplary embodiments described in the following and from the drawings.

DETAILED DESCRIPTION

Figure 1:
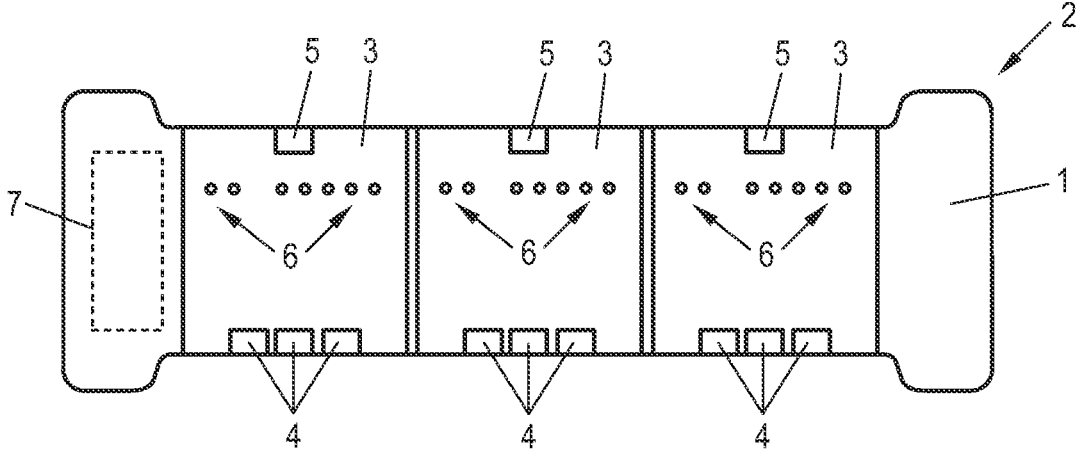
FIG. 1 shows a view of a heat sink of a power electronic arrangement according to the disclosure with power electronic modules.

FIG. 1 shows a schematic view of a heat sink 1 of a power electronic arrangement 2 according to the disclosure, where inverters for a power modules 3 providing an electric machine are already fastened to the heat sink 1. One power module 3 is provided for each phase of the (here) three-phase electric machine. The power modules 3 can be provided, for example, as molded half-bridge modules and encompass power electronic components needing to be cooled, in particular semiconductor switches and diodes. Therefore, the power modules 3 are fastened in the present instance by soldering or sintering to the heat sink 1 and are thermally coupled to it. The power modules 3 each comprise a power electronic substrate, on which the power electronic components are provided. Now, on this substrate in the present case the power contacts of the power modules 3 are also formed, specifically being exposed in corresponding cutouts of the housing of the power modules 3 for the contacting. The heat sink 1 here, as can be seen from FIG. 1, is oblong in configuration, and the power modules 3 are arranged in succession in a middle region in the longitudinal direction. Three connection contacts 4 for the DC voltage side are formed on one edge of the power electronic substrate at one long side, which are to be connected to an intermediate circuit, specifically, an intermediate circuit energy accumulator, here, an intermediate circuit capacitor. On the opposite long side, likewise on the power electronic substrate in the present instance, connection contacts 5 for the corresponding phase are provided for the stator windings of the electric machine. Control terminals 6 can emerge, for example as press-fit connections, from the top side of the power modules 3 and make contact with a circuit board of the power electronic arrangement 2, not shown more closely here.

It should be further mentioned that, in the case of an externally excited synchronous machine as the electric machine, an exciter module 7 containing an exciter circuit, indicated by the dotted line in FIG. 1, can also be fastened to the heat sink 1 and be thermally attached to it.

Figure 2:
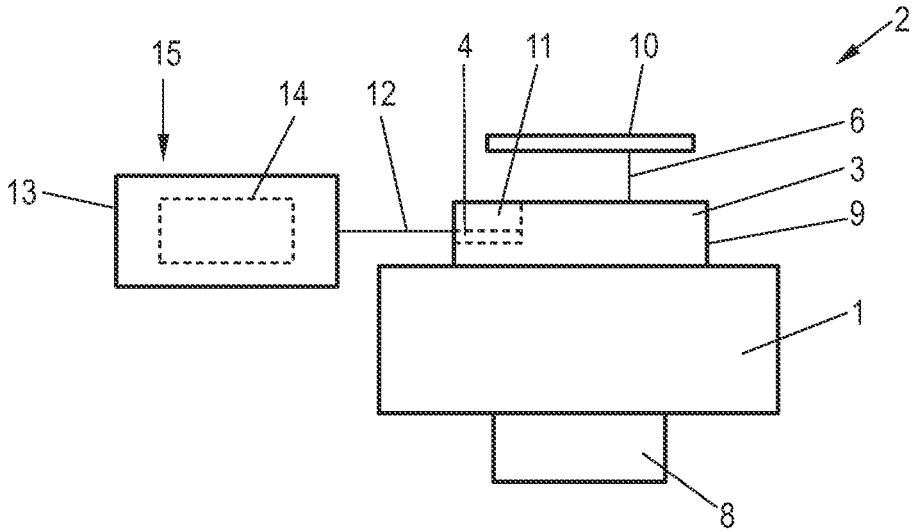
FIG. 2 shows a schematic side view of a power electronic arrangement according to the disclosure.

FIG. 2 shows a schematic side view of the power electronic arrangement 2 according to the disclosure, on which a coolant supply or coolant drain 8 is also schematically recognizable. On the heat sink 1 there is positioned a housing 9 of the power modules 3, formed for example from a hardened casting compound material, from which the control terminals 6 emerge and to which a circuit board 10 is connected for actuating purposes. While the connection contacts 5 and the connection to the electric machine are not shown more closely here for clarity of drawing, the housing cutout 11 with the connection contacts 4 is indicated by dotted line. The connection contacts 4, i.e., on the DC voltage side, are connected by connecting tabs 12 elongated as busbars to an intermediate circuit energy accumulator 14 provided in a housing 13, indicated by dotted lines, being here an intermediate circuit capacitor forming an intermediate circuit 15. The housing 13 for example can be supported by way of a molded fixture piece. Since the connection contacts 4 are provided flat on the substrate, which is actively cooled by way of the heat sink 1, they can also serve for the heat dissipation of the intermediate circuit energy accumulator 14.

It should further be noted that, in the present instance, in order to provide a coaxial connection design, three connection contacts 4 are provided for the DC voltage side, one connection contact 4 for one polarity being provided next to two connection contacts 4 of the other polarity.

Figure 3:
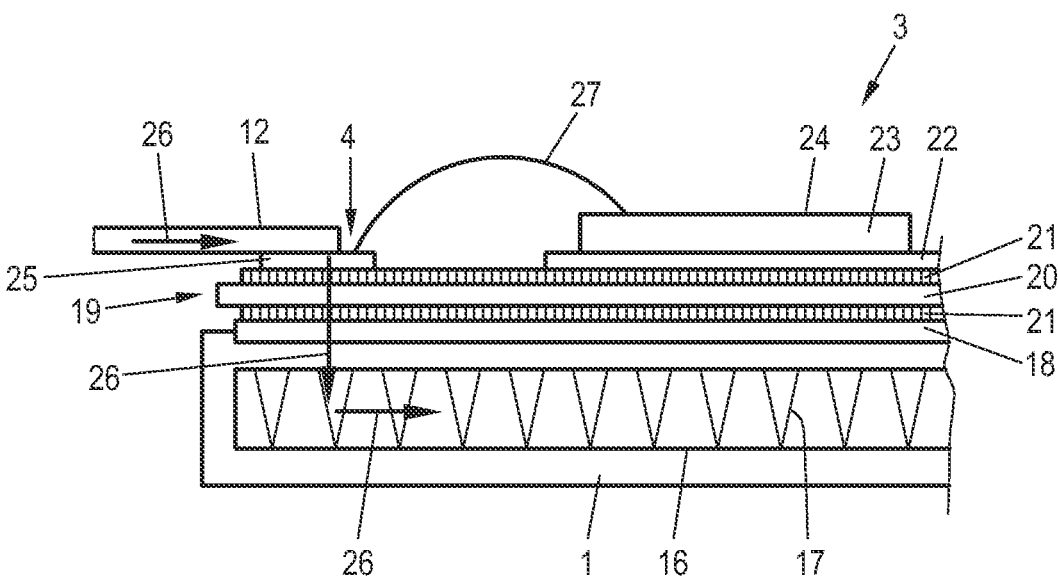
FIG. 3 shows a diagram explaining a layered structure and heat transport.

FIG. 3 shows schematically in a cross sectional view the region of the connection contacts 4 more closely. In the present instance, the housing 9, in particular the casting compound material of the power electronic module 3, is not shown for clarity of the drawing.

First of all, it is evident from FIG. 3 that the heat sink 1 for the active cooling by way of a cooling fluid, here cooling water, comprises a cavity 16 having a cooling structure 17, for example one comprising cooling fins and/or cooling pins, through which the cooling fluid flows to carry away the heat. The cavity 16 here extends basically across the surface covered by the power module 3. The heat sink 1 can consist of aluminum, for example.

The power module 3 is fastened by soldering or sintering on the heat sink 1 by way of a connection layer 18 having good thermal conductivity. The power electronic substrate 19, configured here as a DBC substrate, comprises a ceramic substrate material 20, which is provided on both sides with a metallization layer 21, here, a copper layer. On the top-side metallization layer 21, across a corresponding, in particular insulating, fastening material 22, there can be arranged one of the power electronic components 24, provided here as a chip 23. The power electronic component 24, such as a semiconductor switch or a diode, is actively cooled by the excellent thermal attachment via the substrate 19 and the connection layer 18 to the heat sink 1, as is basically known.

To form the connection contact 4, a connection layer 25 likewise consisting of copper is applied to the metallization layer 21. Hence, the connection tab 12, which leads to the intermediate circuit energy accumulator 14 in the housing 13, is connected flat and thermally optimally and electrically connected to the connection contact 4 by welding, especially laser welding or ultrasound welding, hence without using additional materials. The connection tab 12 here can likewise consist of copper.

Thanks to the excellent flat thermal and electrical attachment of the connection tab 12 to the connection contact 4, a good heat transport through the connection tab 12 to the connection contact 4 also exists. This, in turn, is attached by the substrate 19 in excellent manner to the active cooling by way of the cooling fluid in the cavity 16, so that an active cooling of the intermediate circuit energy accumulator 14 via the power module 3 by the heat sink 1 can occur, as shown by the arrows 26.

It should be further mentioned here that the connection contacts 4 can also be connected by bonding wires 27 to power electronic components 24, as is basically known.

The housing 13 can also accommodate multiple intermediate circuit energy accumulators 14, especially intermediate circuit capacitors, and already contain the complete circuitry for the intermediate circuit 15. Furthermore, intermediate circuit capacitors can be realized especially preferably as thin layer capacitors, and the connecting tabs 12 can emerge directly into this layered structure.

Figure 4:
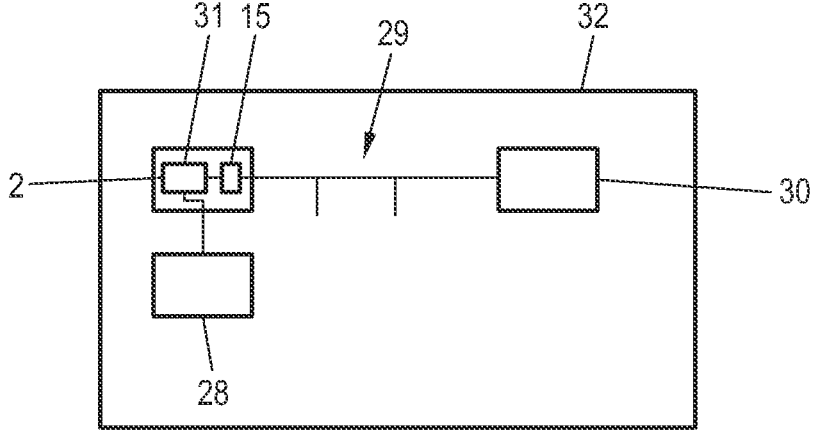
FIG. 4 shows a diagram of a motor vehicle according to the disclosure.

FIG. 4 finally shows a diagram of a motor vehicle 32 according to the disclosure. The motor vehicle 32 in the present instance is configured as an electric motor vehicle and comprises an electric machine 28 in its drive train as a drive machine or traction machine, which can be designed for example as a permanently excited or externally excited synchronous machine. Through a power electronic arrangement 2 according to the disclosure, the electric machine 28 is connected to a high-voltage network 29 of the motor vehicles 32, which is fed from a traction energy accumulator 30, in the present instance a high-voltage battery. The stator windings of the three-phase electric machine 28 are connected at first via the connection contacts 5 to the inverter 31, provided by the power modules 3, which is connected via the connection contacts 4 to the intermediate circuit 15 and thus to the high-voltage network 29.

German patent application no. 102022133265.9, filed Dec. 14, 2022, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A power electronic arrangement for an electric machine, comprising:

an inverter;

a plurality of power electronic components accommodated in at least one power module;

an intermediate circuit connected to the inverter across connection contacts of the at least one power module and having at least one intermediate circuit energy accumulator, and a heat sink to which the at least one power module is thermally connected for cooling, wherein the heat sink includes a cavity that, in operation, receives a flow of a cooling fluid, and includes a cooling structure located in the cavity, wherein the connection contacts are arranged at a margin and flat against a substrate carrying one or more power semiconductors, and are arranged in a region adjacent to the cooling structure located in the cavity of the heat sink which is associated with the at least one power module such that the connection contacts of the at least one power module are thermally coupled to the heat sink via the substrate, and wherein the at least one intermediate circuit energy accumulator is connected electrically and thermally to the connection contacts to cool the at least one intermediate circuit energy accumulator.

2. The power electronic arrangement according to claim 1, wherein the at least one intermediate circuit energy accumulator is at least one intermediate circuit capacitor.

3. The power electronic arrangement according to claim 1, wherein the connection contacts include a metallization layer of the substrate, or the substrate is a Direct Bond Copper (DBC) substrate.

4. The power electronic arrangement according to claim 1, wherein the connection contacts includes a connection layer applied to the substrate.

5. The power electronic arrangement according to claim 4, wherein the connection layer is a copper layer applied to a metallization layer of the substrate.

6. The power electronic arrangement according to claim 1, wherein the intermediate circuit is connected by flat connecting tabs to the connection contacts.

7. The power electronic arrangement according to claim 6, wherein the flat connecting tabs are made of copper.

8. The power electronic arrangement according to claim 6, wherein the flat connecting tabs are welded onto the connection contacts.

9. The power electronic arrangement according to claim 6, wherein the at least one intermediate circuit energy accumulator is received in a housing from which the connecting tabs stick out.

10. The power electronic arrangement according to claim 1, wherein the at least one power module is thermally attached and fastened to the heat sink by soldering or sintering.

11. A motor vehicle, comprising:

an electric machine that operates as a traction machine; and a power electronic arrangement associated with the electric machine, wherein the power electronic arrangement includes:

an inverter;

a plurality of power electronic components accommodated in at least one power module;

an intermediate circuit connected to the inverter across connection contacts of the at least one power module and having at least one intermediate circuit energy accumulator, and a heat sink to which the at least one power module is thermally connected for cooling, wherein the heat sink includes a cavity that, in operation, receives a flow of a cooling fluid, and includes a cooling structure located in the cavity, wherein the connection contacts are arranged at a margin and flat against a substrate carrying one or more power semiconductors, and are arranged in a region adjacent to the cooling structure located in the cavity of the heat sink which is associated with the at least one power module such that the connection contacts of the at least one power module are thermally coupled to the heat sink via the substrate, and wherein the at least one intermediate circuit energy accumulator is connected electrically and thermally to the connection contacts to cool the at least one intermediate circuit energy accumulator.

* * * * *